(12) United States Patent
Kawasumi (10) Patent No.: US 7,068,552 B2
(45) Date of Patent: *Jun. 27, 2006

(54) SENSE AMPLIFIER (75) Inventor: Atsushi Kawasumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

This patent is subject to a terminal disclaimer.

(21) Appl. No.: 10/175,959

(22) Filed: Jun. 21, 2002

(65) Prior Publication Data

US 2003/0057520 A1    Mar. 27, 2003

(30) Foreign Application Priority Data

Jun. 21, 2001    (JP)    ............................. 2001-188558

(51) Int. Cl.
*G11C 16/04*    (2006.01)
(52) U.S. Cl. .................. 365/200; 365/221; 365/222
(58) Field of Classification Search ................ 257/553; 365/200–222
See application file for complete search history.

(56) References Cited

U.S. PATENT DOCUMENTS

2003/0057520 A1 *    3/2003    Kawasumi ................... 257/553
2004/0071026 A1 *    4/2004    Hidaka ........................ 365/200
2004/0120201 A1 *    6/2004    Ito ............................. 365/222

FOREIGN PATENT DOCUMENTS

JP    2000-194304    7/2000

OTHER PUBLICATIONS

Pederson, et al., "Large-Signal Performance of the Basic Gain Stages in Analog ICs", Analog Integrated Circuits for Communication, Chapt. 1, Sec. 1, "The Emitter-Coupled Pair", 1991, pp. 1 & 2.

* cited by examiner

*Primary Examiner*—Hoai Pham
*Assistant Examiner*—Nathan W. Ha
(74) *Attorney, Agent, or Firm*—Oblon, Spivak, McClelland, Maier & Neustadt, P.C.

(57)    ABSTRACT

A sense amplifier configured to amplify and output complementary input signals, comprising: a pair of first and second transistors; a pair of first and second resistor elements which are connected to at least one of source terminals and drain terminals of the first and second transistors, and pass electric current corresponding to a difference between threshold voltages of the first and second transistors; and an output terminal which is connected to a terminal different from the terminal to which the first and second resistor elements are connected, among the source terminal and the drain terminal of the first and second transistors, or which is connected to an end different from an end to which the source terminal and the drain terminal of the first and second transistors are connected, among both the ends of the first and second resistor elements.

6 Claims, 11 Drawing Sheets

SENSE AMPLIFIER

CROSS REFERENCE TO RELATED APPLICATIONS

This application is based upon and claims the benefit of priority from the prior Japanese Patent Applications No. 2001-188558, filed on Jun. 21, 2001, the entire contents of which are incorporated herein by reference.

BACKGROUND OF THE INVENTION

1. Field of the Invention

The present invention relates to a sense amplifier used for a semiconductor integrated circuit such as an SRAM (Static Random Memory).

2. Related Background Art

Figure 18:
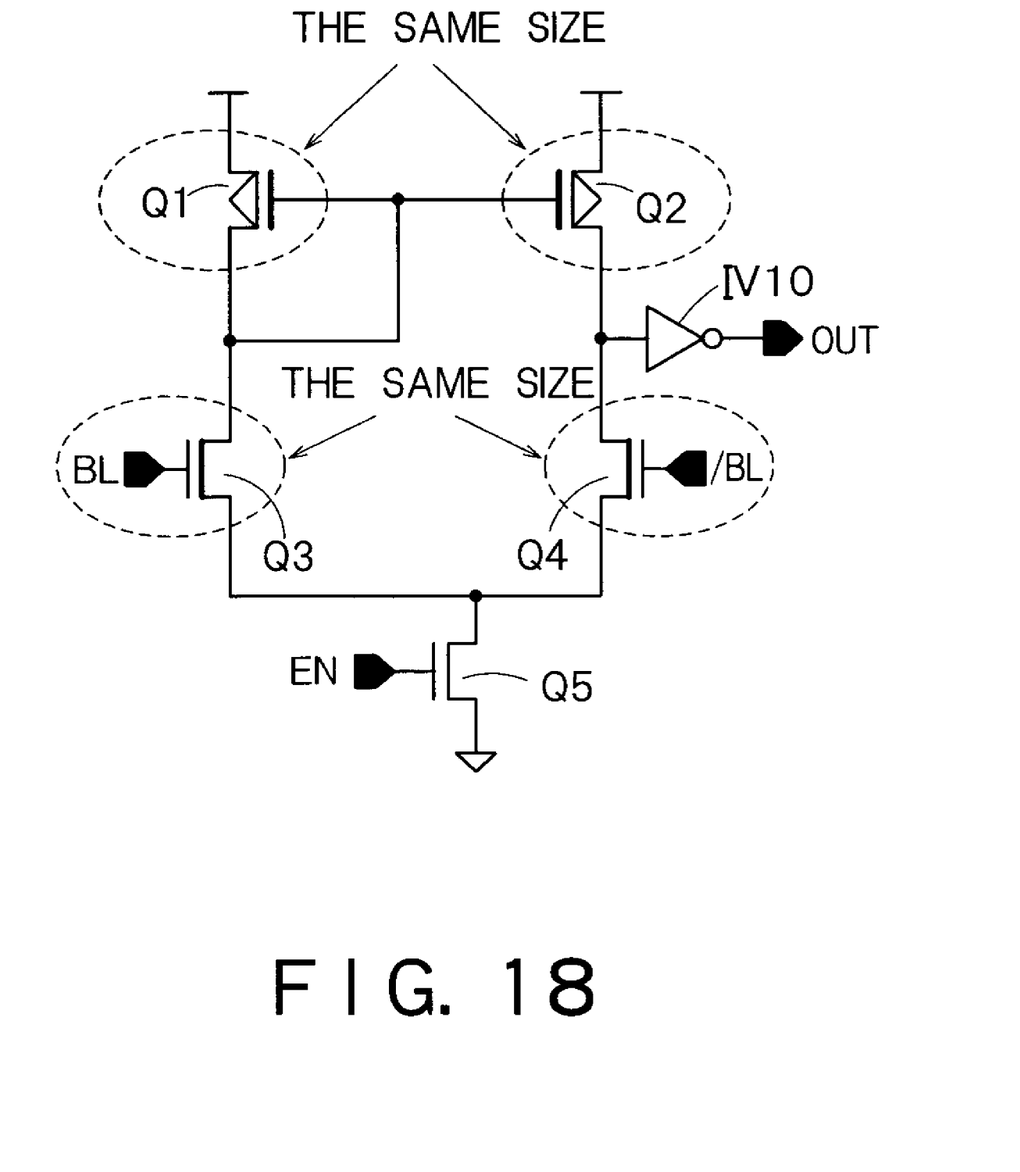
FIG. 18 is a circuit diagram of the conventional sense amplifier.

FIG. 18 is a circuit of the conventional sense amplifier. The sense amplifier of FIG. 18 has PMOS transistors Q1 and Q2 composing a current mirror circuit, a pair of NMOS transistors Q3 and Q4 connected to the current mirror circuit, and an NMOS transistor Q5 connected between source terminals of the NMOS transistors Q3 and Q4, and a ground terminal. The gate terminals of the NMOS transistors Q3 and Q4 are connected to a pair of bit lines BL and /BL, and a sense signal is outputted via an inverter IV10 from a connection point between the PMOS transistor Q2 and the NMOS transistor Q4.

Because it is desirable that electrical properties of a pair of the NMOS transistors Q3 and Q4 are equal, channel widths, channel lengths and threshold voltages of the NMOS transistors Q3 and Q4 are equalized to each other.

However, due to dispersion in fabrication, sizes and threshold voltages of the NMOS transistors Q3 and Q4 are not necessarily equal to each other. Because of this, when the voltage difference of the pair of bit lines is small, due to the dispersion of the threshold voltages of the NMOS transistors Q3 and Q4, the output of the sense amplifier becomes a polarity opposite to the original polarity according to circumstances. The minimum voltage difference between the pair of the bit lines necessary for normalizing the output of the sense amplifier is called as an input offset voltage, merely an offset voltage or an offset.

Hereinafter, the problem of the conventional technologies will be explained based on an example of the sense amplifier used for the SRAM.

The sense amplifier used for the SRAM amplifies a very little voltage difference between the pair of bit lines for transferring data of the memory cell. Because the voltage difference between the pair of bit lines is generated due to the current drawn the memory cell, the longer the time required for the memory cell to draw the current from the bit lines is, the larger the voltage difference becomes. When the voltage difference surpasses the offset voltage of the memory cell, the sense operation is carried out for the first time. Accordingly, if it is necessary to operate the SRAM at a high speed, it is desirable to speed up the sense operation by minifying the offset voltage of the sense amplifier.

Here, it is assumed that the sense timing of the sense amplifier is adjusted by using a dummy bit line sense amplifier for sensing a dummy bit line. In this case, it is desirable to decide the timing that the dummy bit line sense amplifier outputs an output signal, based on only the voltage difference of the dummy bit line without depending on an activation signal from outside.

Figure 19:
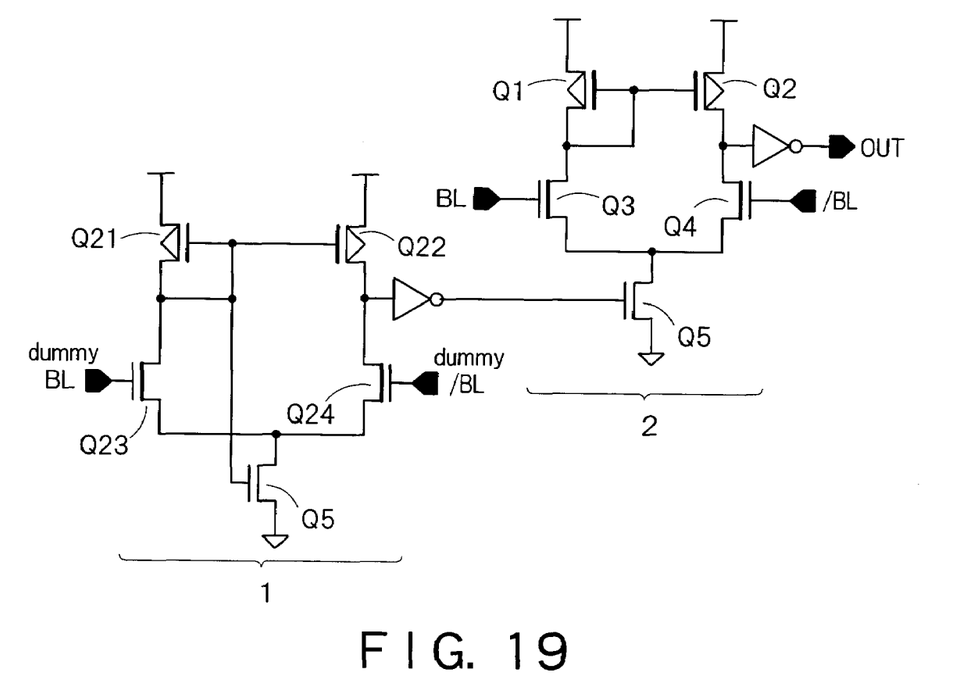
FIG. 19 is a circuit diagram of the conventional dummy bit line sense amplifier.

FIG. 19 is a conventional dummy bit line sense amplifier, an output of which varies in accordance with the input voltage difference. The sense circuit 2 performs the sense operation based on the output of the dummy bit line sense amplifier 1. If the offset voltage of the dummy bit line sense amplifier is different from each chip, the activation timing of the sense amplifier fluctuates. Because of this, it is desirable to set the offset voltage to be, for example 0V.

Figure 20:
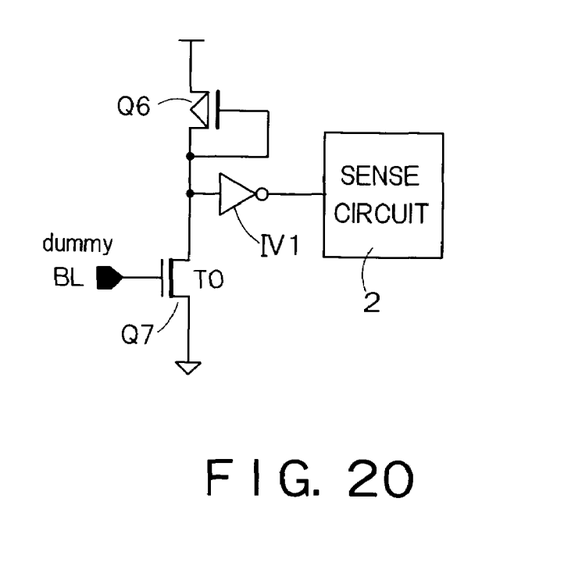
FIG. 20 is a circuit diagram of the conventional single phase dummy bit line sense amplifier.

There is a single-phase input sense amplifier as shown in FIG. 20 as the dummy bit line sense amplifier. In this case, the timing in which the sense output is obtained is decided by the threshold voltage Vth of the transistor Q7 in the dummy bit line sense amplifier. Because the threshold voltage Vth fluctuates in the chip, for example, if the threshold voltage Vth of the transistor Q7 becomes small, the output timing of the dummy bit line sense amplifier becomes early, thereby causing a malfunction.

Incidentally, the gate length of the transistor composing the sense amplifier and the dummy bit line sense amplifier fluctuates wafer by wafer or lot by lot due to fabrication dispersion. It is well known that as the gate length is shorter, the threshold voltage Vth of the transistor fluctuates largely. When the gate length becomes short, the offset voltage of the sense amplifier or the dummy bit line sense amplifier becomes large. Because of this, there is a likelihood that a malfunction occurs if the activation signal of the sense amplifier is not delayed.

SUMMARY OF THE INVENTION

A sense amplifier according to an embodiment of the present invention, configured to amplify and output complementary input signals, comprising: a pair of first and second transistors; a pair of first and second resistor elements which are connected to at least one of source terminals and drain terminals of said first and second transistors, and pass electric current corresponding to a difference between threshold voltages of said first and second transistors; and an output terminal which is connected to a terminal different from the terminal to which said first and second resistor elements are connected, among the source terminal and the drain terminal of said first and second transistors, or which is connected to an end different from an end to which the source terminal and the drain terminal of said first and second transistors are connected, among both the ends of said first and second resistor elements.

Furthermore, a sense amplifier configured to amplify and output signals on a pair of bit lines, comprising: a dummy bit line sense amplifier which amplifies and outputs a signal on a dummy bit line; and a sense circuit which controls a timing for amplifying the signals on the pair of bit lines based on the output of said dummy bit line sense amplifier, wherein said dummy bit line sense amplifier includes a first transistor having a gate terminal connected to said dummy bit line, and a first resistor element which passes electric current in accordance with a threshold voltage of said first transistor.

DESCRIPTION OF THE PREFERRED EMBODIMENTS

Hereinafter, a sense amplifier according to the present invention will be described more specifically with reference to drawings.

First Embodiment

Figure 1:
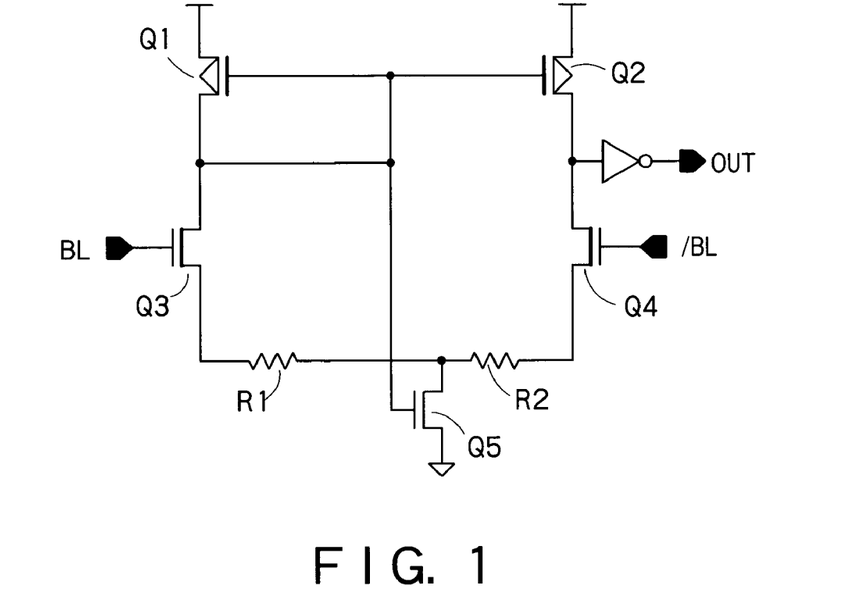
FIG. 1 is a circuit diagram of a first embodiment of a sense amplifier according to the present invention.

FIG. 1 is a circuit diagram of a first embodiment of a sense amplifier according to the present invention. The sense amplifier of FIG. 1 is a current mirror type of sense amplifier. The sense amplifier has a current mirror circuit composed of PMOS transistors Q1 and Q2, a pair of NMOS transistors Q3 and Q4 each having a gate terminal connected to a pair of bit lines, resistor elements R1 and R2 connected between source terminals of NMOS transistors Q3 and Q4, and an NMOS transistor Q5 which composes a constant current source and is connected between a connection point of the resistor elements R1, R2 and a ground terminal.

That is, the sense amplifier of FIG. 1 has a configuration in which the resistor elements R1 and R2 are added to the sense amplifier of FIG. 18.

Here, the threshold voltages Vth of the NMOS transistors Q3 and Q4 are different from each other by ΔVth. The same voltage V is applied to the gate terminals of the NMOS transistors Q3 and Q4. It is assumed that the voltage difference between the resistor elements R1 and R2 is 0V, and the NMOS transistors Q3 and Q4 operate at a pentode region.

Figure 2:
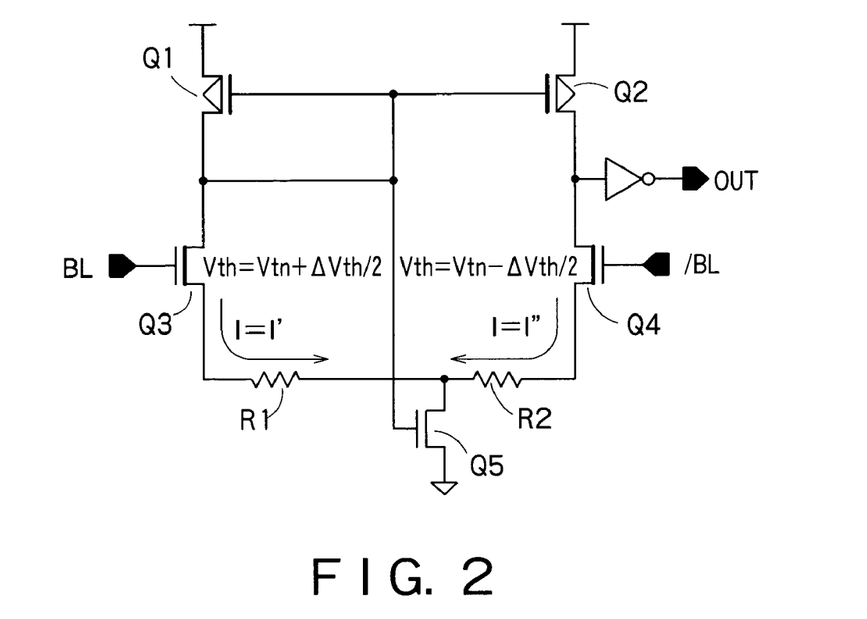
FIG. 2 is a diagram showing a direction of electric current flowing through the circuit of FIG. 1.

FIG. 2 is a diagram showing a direction of the current flowing through the circuit of FIG. 1. As shown in FIG. 2, when the current flowing though the resistor element R1 at left side is assumed as I', the voltage V' at both ends of the resistor element R1 is expressed by equation (1).

$$V' = RI' \quad (1)$$

Because the current flowing through the NMOS transistor Q3 is equal, a relationship of equation (2) is established. β is a current gain.

$$I' = \beta/2\{(V-RI')-(Vthn+\Delta Vth/2)^2 \quad (2)$$

Similarly, the current I" flowing through the resistor element R2 at the right side of the sense amplifier is expressed by equation (3).

$$I'' = \beta/2\{(V-RI'')-(Vthn-\Delta Vth/2)^2 \quad (3)$$

If simultaneous equations (2) and (3) are solved as I'=I", the values of the resistor elements R1 and R2 to satisfy I'=I" can express as a function of the voltage V, the threshold voltage Vthn and ΔVth. It is possible to set the offset voltage of the sense amplifier to be substantially zero by inserting the resistor elements R1 and R2 having the resistance near to substantially R, to the source sides of the NMOS transistors Q3 and Q4.

Thus, according to the present embodiment, the resistor elements R1 and R2 are connected between the source terminals of the NMOS transistors Q3 and Q4, and the resistances of the resistor elements R1 and R2 are set so that the offset voltage of the sense amplifier become substantially zero. Because of this, it is possible to cancel out the offset voltage of the sense amplifier, even if a circuit for offset cancel is not provided separately. Accordingly, even if the voltage difference of the pair of bit lines BL and /BL is small, there is no likelihood that the sense amplifier operates erroneously.

Second Embodiment

Figure 3:
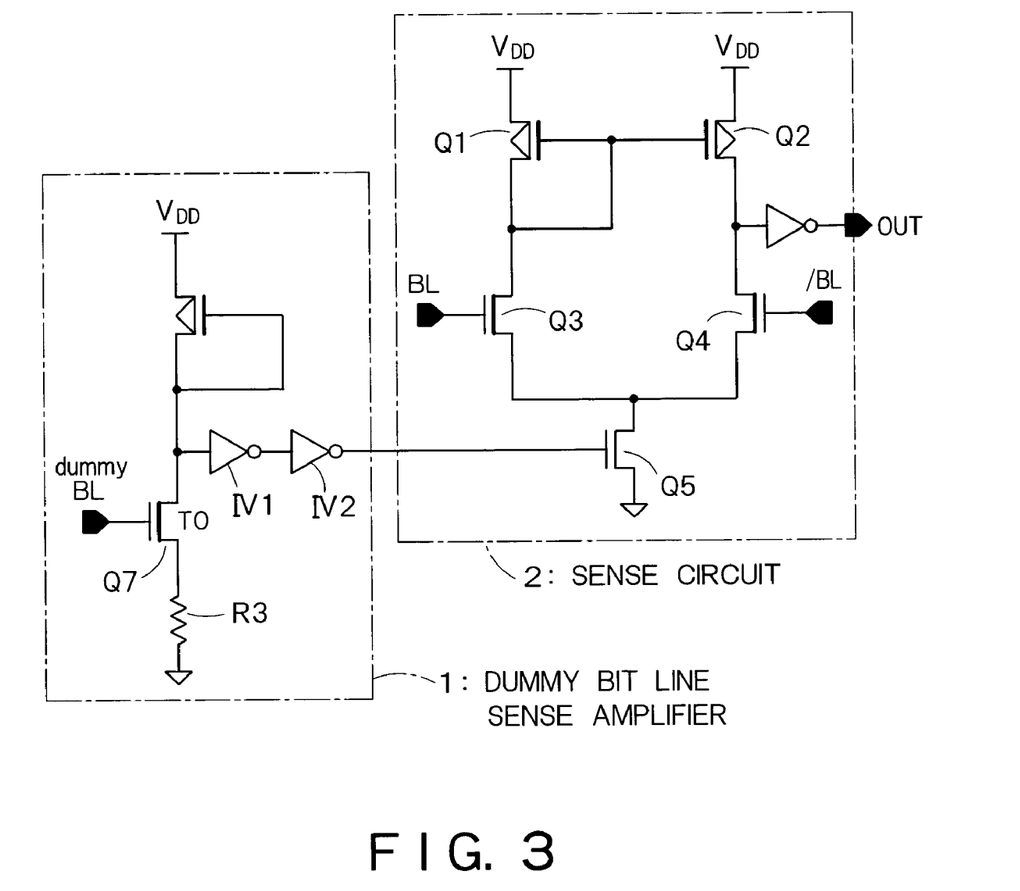
FIG. 3 is a circuit diagram of a second embodiment of a sense amplifier according to the present invention.

In the second embodiment, the resistor elements R1 and R2 for offset cancel are connected to a dummy bit line sense amplifier.

FIG. 3 is a circuit diagram of a second embodiment of a sense amplifier according to the present invention. The sense amplifier of FIG. 3 has a dummy bit line sense amplifier 1 and a sense circuit 2 for performing sense operation of a pair of bit lines in accordance with the output of the dummy bit line sense amplifier 1. The sense circuit 2 of FIG. 3 has a PMOS transistor Q1 and Q2 composing a current mirror circuit, a pair of NMOS transistors Q3 and Q4 each having a gate terminal connected to the pair of bit lines, and an NMOS transistor Q5 connected to the respective source terminals of the NMOS transistors Q3 and Q4.

The dummy bit line sense amplifier 1 of FIG. 3 has a PMOS transistor Q6 and an NMOS transistor Q7 connected in series between a power supply terminal VDD and a ground terminal, an inverter IV1 connected to a connection point of the transistors Q6 and Q7, and a resistor R3 connected between a source terminal of the NMOS transistor Q7 and the ground terminal.

Because the gate and drain of the PMOS transistor Q6 are short-circuited to each other, the transistor Q6 acts as a resistor. A dummy bit line dummyBL is connected to the gate terminal of the NMOS transistor Q7.

The resistor element R3 is provided to cancel out the dispersion of the threshold voltage of the NMOS transistor Q7, similarly to the resistor elements R1 and R2 of FIG. 1.

For example, when the threshold voltage Vth of the NMOS transistor Q7 is low, the NMOS transistor Q7 is easy to turn on. When the current between the drain and source of the NMOS transistor Q7 increases, the voltage at both ends of the resistor R3 becomes high, and the threshold voltage Vth appears to be high. By such an operation, it is possible to cancel out the offset voltage of the NMOS transistor Q7.

It is desirable to form the resistor R3 of FIG. 3 by using polysilicon used as the material for forming the gate terminal of the NMOS transistor Q7, and in the same fabrication step as that of the gate terminal. The reason for this is to make narrower the width of the resistor element R3 as the gate length of the NMOS transistor Q7 becomes shorter.

That is, when the gate length of the NMOS transistor Q7 becomes short due to the fabrication dispersion and so on, the fluctuation of the threshold voltage of the NMOS transistor Q7 becomes large. Because of this, if the output timing of the dummy bit line sense amplifier 1 is not delayed, the sense amplifier 2 operates erroneously. It is desirable to heighten the resistance of the resistor element R3 by slenderizing the width of the resistor element R3 in order to delay the output timing of the dummy bit line sense amplifier 1. In the second embodiment, the gate terminal of the NMOS transistor Q7 and the resistor element R3 are formed of the same material to each other in the same fabrication step. Therefore, the shorter the gate length becomes, the narrower the width of the resistor element R3 becomes.

Figure 4:
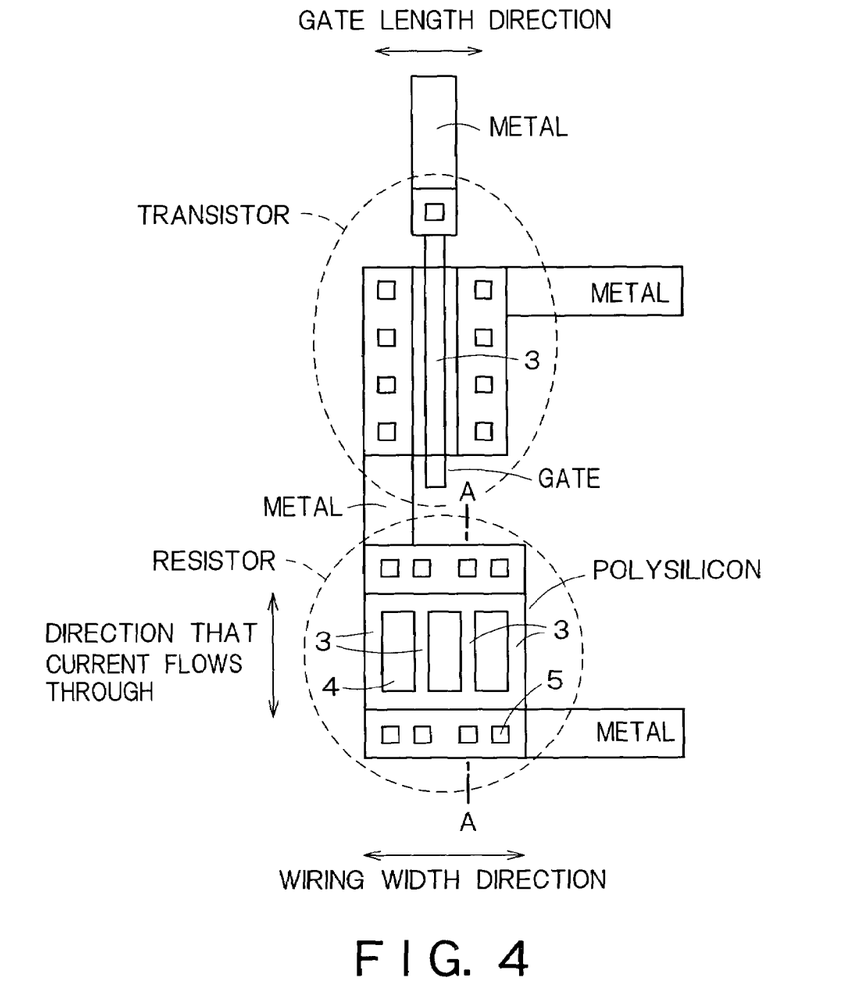
FIG. 4 is a upper face diagram of a resistor of FIG. 3.
Figure 5:
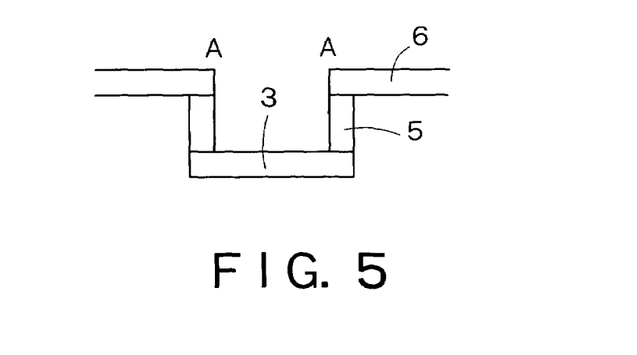
FIG. 5 is a cross sectional diagram of A—A line of FIG. 4.

FIG. 4 is an upper-face diagram of the resistor element R3 of FIG. 3, and FIG. 5 is a cross section diagram of A—A line of FIG. 4. As shown in these diagrams, a plurality of leptosomic type polysilicon layers 3 are arranged in parallel by sandwiching the insulation layer 4. These polysilicon layers 3 are connected to an upper metal layer 6 via contacts 5. The gate length direction (channel length direction) of the NMOS transistor Q7 and the wiring width direction of the resistor element R3 are arranged in parallel to each other. That is, the gate length direction (channel length direction) of the NMOS transistor Q7 and the direction flowing through the current to the resistor R3 are arranged to be substantially orthogonal.

As understood from FIG. 4, the gate is formed of the polysilicon, similarly to the resistor element R3. The shorter the gate length becomes, the shorter the wiring width direction of the resistor element R3 becomes, and the resistance increases.

Thus, according to the second embodiment, the resistor element R3 is connected to the source terminal of the NMOS transistor Q7 in order to cancel out the offset voltage of the NMOS transistor Q7 of the dummy bit line sense amplifier 1. Because of this, the sense amplifier of FIG. 3 is not affected by the fluctuation of the threshold voltage of the NMOS transistor Q7. Furthermore, because the resistor element R3 is formed of the polysilicon which is the same material as that of the gate terminal of the NMOS transistor Q7, as the gate length becomes short, it is possible to heighten the resistance of the resistor element R3 in order to delay the output timing of the dummy bit line sense amplifier. Therefore, there is no likelihood in which the sense amplifier operates erroneously.

Other Embodiment

Although the current mirror type sense amplifier has been explained in the first embodiment, the present invention is applicable to the sense amplifier having the other circuit configuration.

Figure 6:
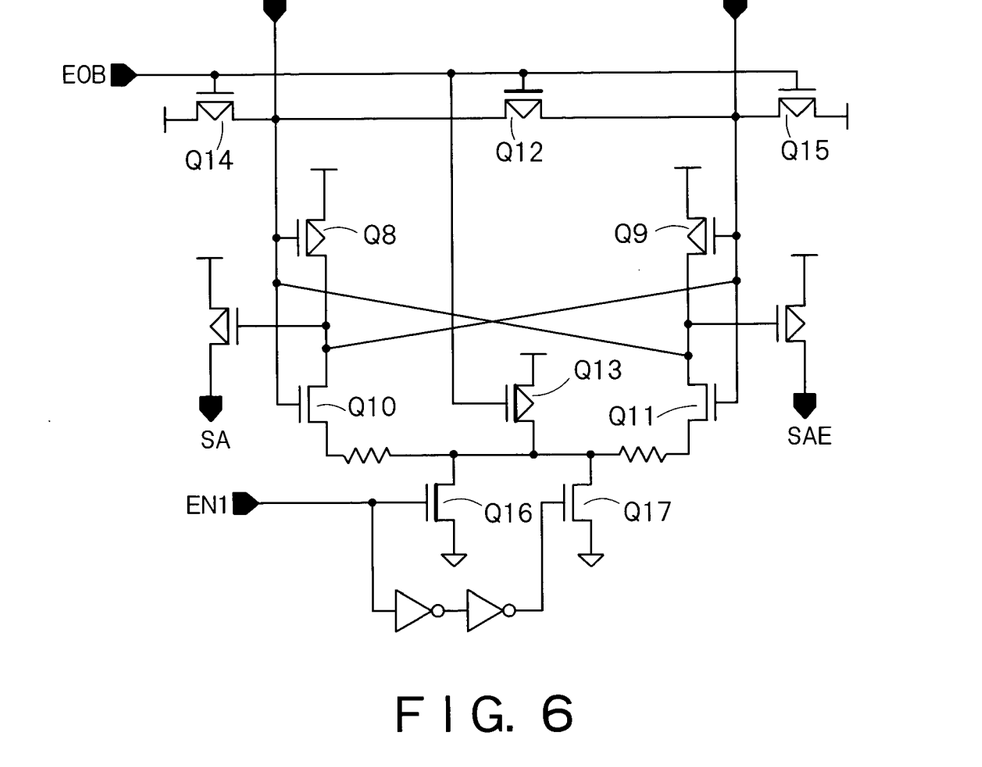
FIG. 6 is a circuit diagram showing an example in which the resistor element is provided to a latch type sense amplifier.

For example, FIG. 6 is a circuit diagram showing an example in which the resistor elements R1 and R2 are provided to a latch type sense amplifier. The sense amplifier of FIG. 6 has PMOS transistors Q8 and Q9 and NMOS transistor Q10 and Q11 composing a latch, PMOS transistors Q14 and Q15 for precharge, resistors R1 and R2 connected between source terminals of the NMOS transistors Q10 and Q11, and NMOS transistors Q16 and Q17 for sense operation control.

The resistor elements R1 and R2 of FIG. 6 are set to the resistance which can cancel out the offset voltages of the PMOS transistors Q8 and Q9 and the NMOS transistors Q10 and Q11 composing the latch. Therefore, there is no likelihood in which the sense operation is affected by the fluctuation of the threshold voltages of the transistors Q8–Q11.

Figure 7:
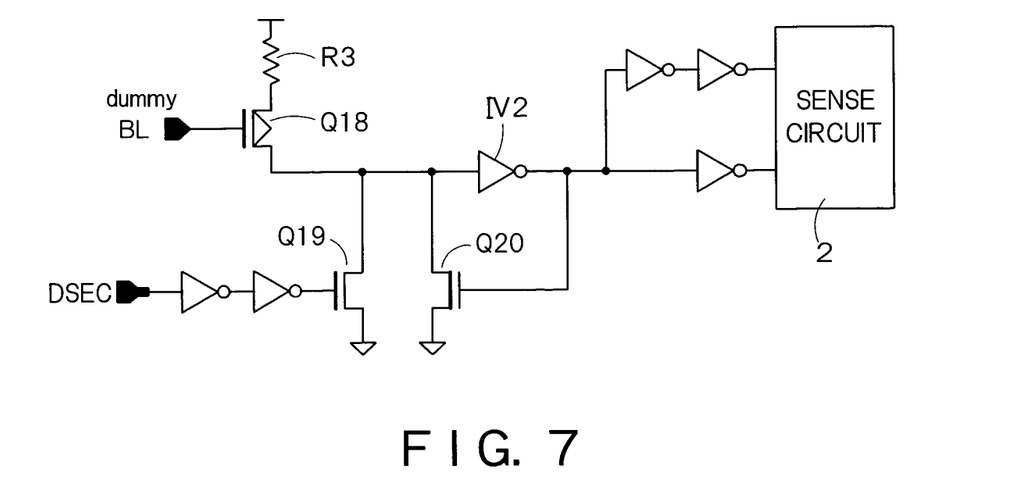
FIG. 7 is a circuit diagram showing an example in which the resistor element is provided to the latch type dummy bit line sense amplifier.

FIG. 7 is a diagram showing an example in which a resistor R3 is provided to the latch type dummy bit line sense amplifier 1. The dummy bit line sense amplifier 1 of FIG. 7 has a PMOS transistor Q18 having a gate terminal connected to the dummy bit line dummyBL, an NMOS transistor Q19 for precharge and an NMOS transistor Q20 and an inverter IV2 for performing latch operation.

As described above, the resistor R3 of FIG. 7 is formed of the same fabrication step as that of the gate terminal by using the same material as that of the gate terminal, for example, a polysilicon. Therefore, the shorter the gate length becomes, the higher the resistance of the resistor R3 becomes, thereby delaying the sense timing.

Although a simple phase type of the dummy bit line sense amplifier has been described in the above embodiment, concrete circuit configurations of the dummy bit line sense amplifier are not limited. For example, as shown in FIG. 8, the resistor elements R1 and R2 may be provided in the latch type dummy bit line sense amplifier.

Figure 9:
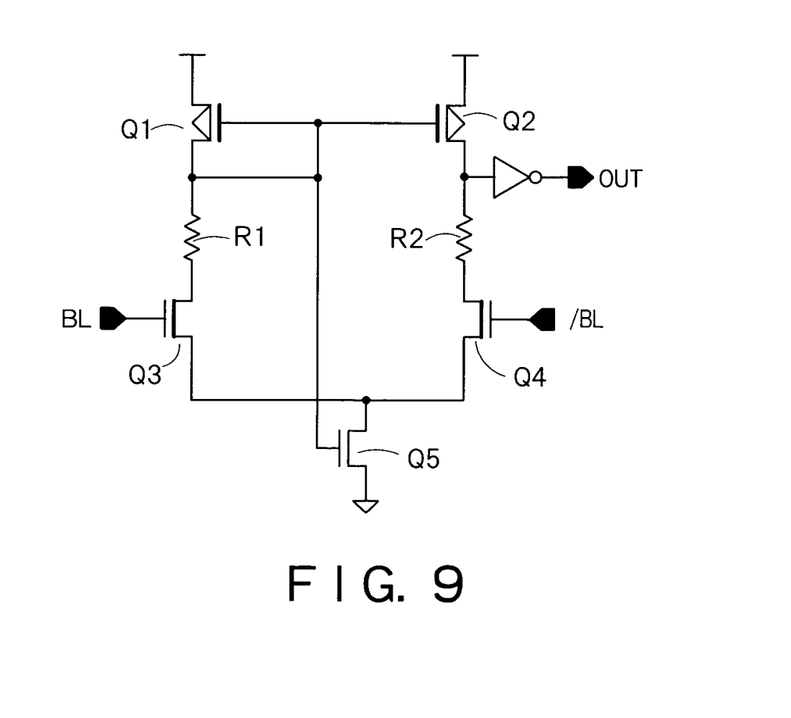
FIG. 9 is a circuit diagram showing a modified example of FIG. 1 in which the resistor element is connected to the drain terminal.
Figure 10:
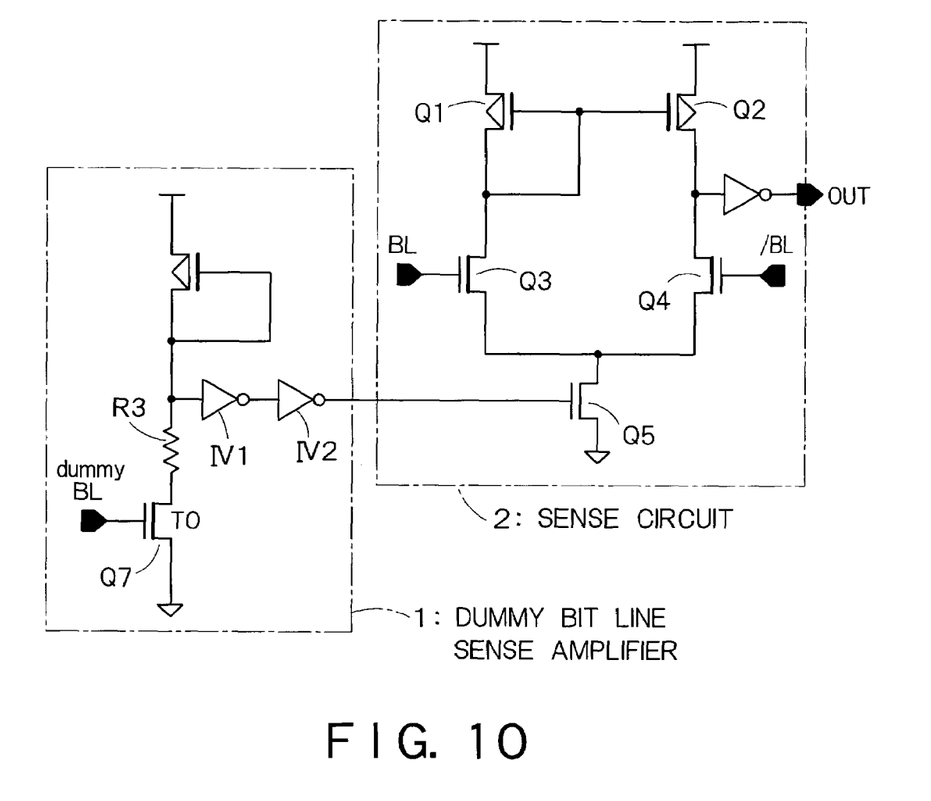
FIG. 10 is a circuit diagram showing a modified example of FIG. 3 in which the resistor element is connected to the drain terminal.

Although an example in which the resistor elements are connected to the NMOS transistors or the PMOS transistors has been described in the above embodiment, even if the resistor elements are connected to the drain terminal as shown in FIG. 9 and FIG. 10, it is possible to cancel out the offset voltage of the transistors on some level. FIG. 9 is a modified example of FIG. 1, and FIG. 10 is a modified example of FIG. 3.

Figure 8:
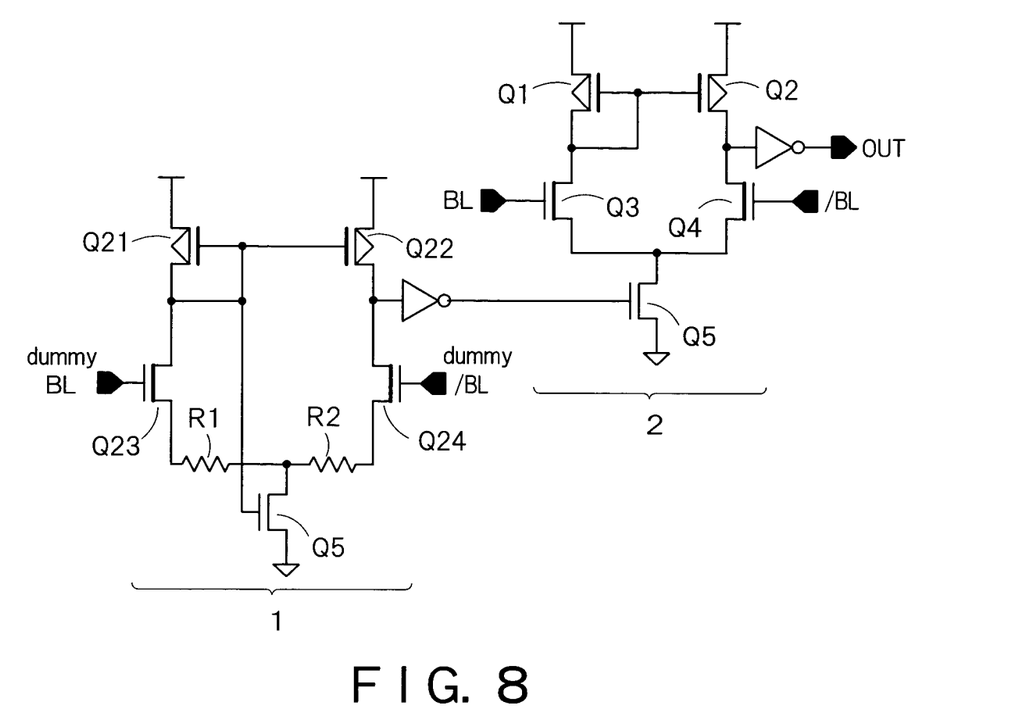
FIG. 8 is a circuit diagram showing an example in which the resistor element is provided to the latch type dummy bit line sense amplifier.
Figure 11:
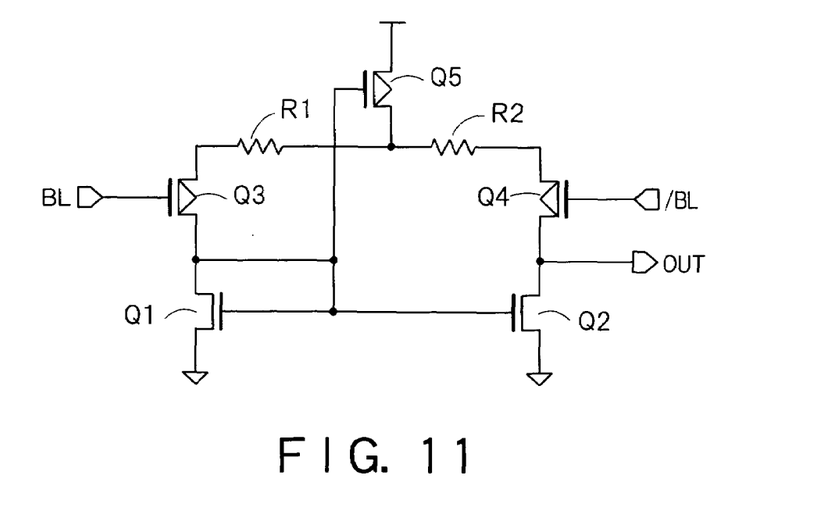
FIG. 11 is a circuit diagram showing an example in which a conductive type of the transistor of FIG. 1 is contrary.
Figure 12:
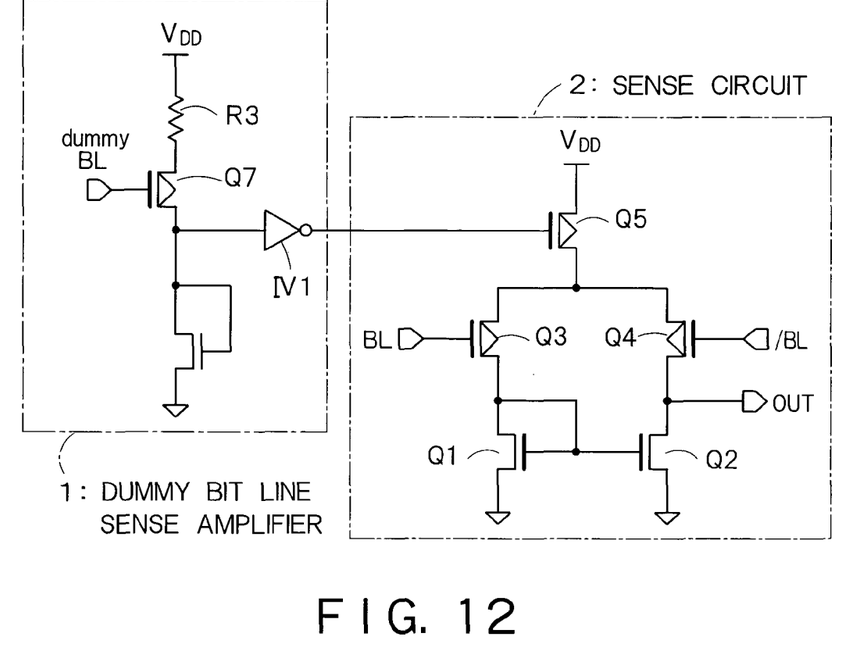
FIG. 12 is a circuit diagram showing an example in which a conductive type of the transistor of FIG. 3 is contrary.
Figure 13:
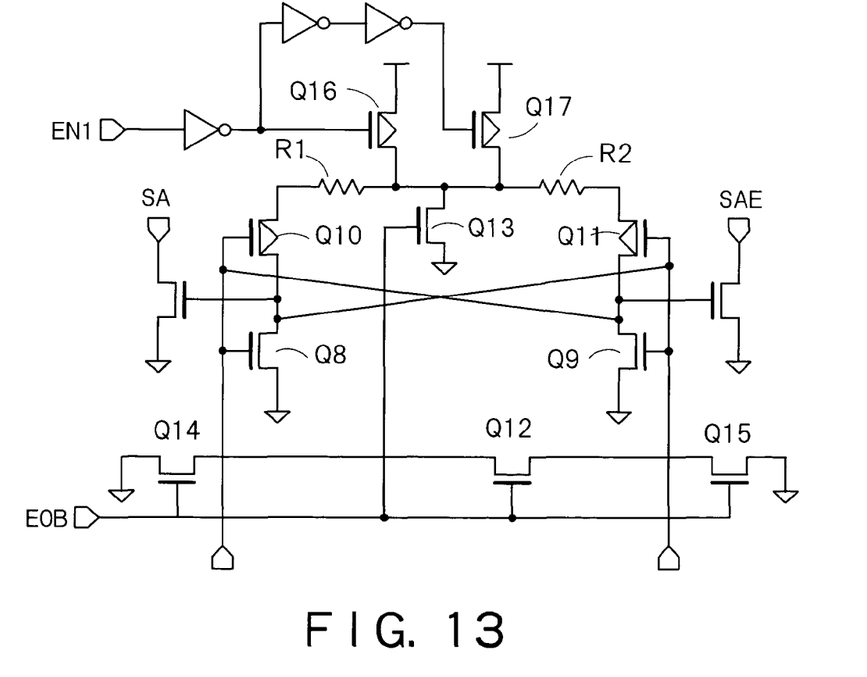
FIG. 13 is a circuit diagram showing an example in which a conductive type of the transistor of FIG. 6 is contrary.
Figure 14:
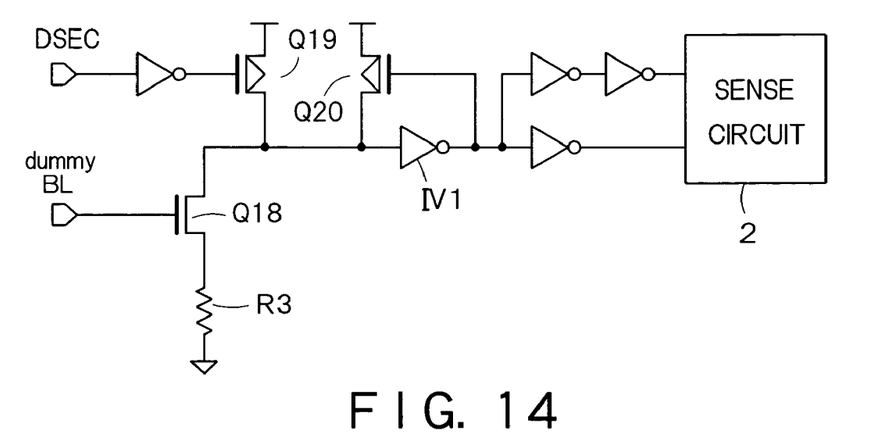
FIG. 14 is a circuit diagram showing an example in which a conductive type of the transistor of FIG. 7 is contrary.
Figure 15:
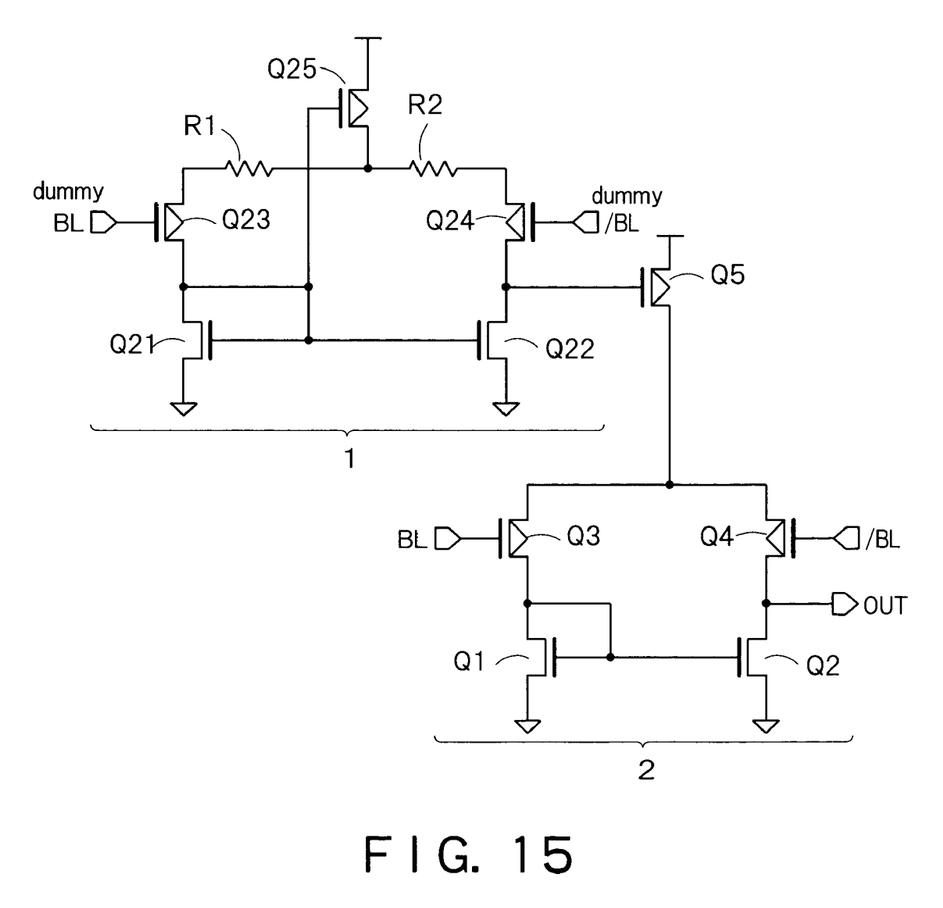
FIG. 15 is a circuit diagram showing an example in which a conductive type of the transistor of FIG. 8 is contrary.
Figure 16:
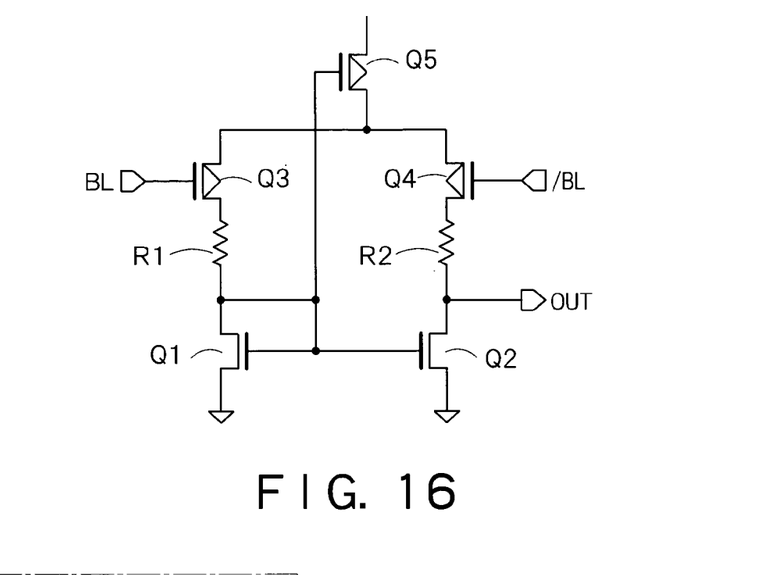
FIG. 16 is a circuit diagram showing an example in which a conductive type of the transistor of FIG. 9 is contrary.
Figure 17:
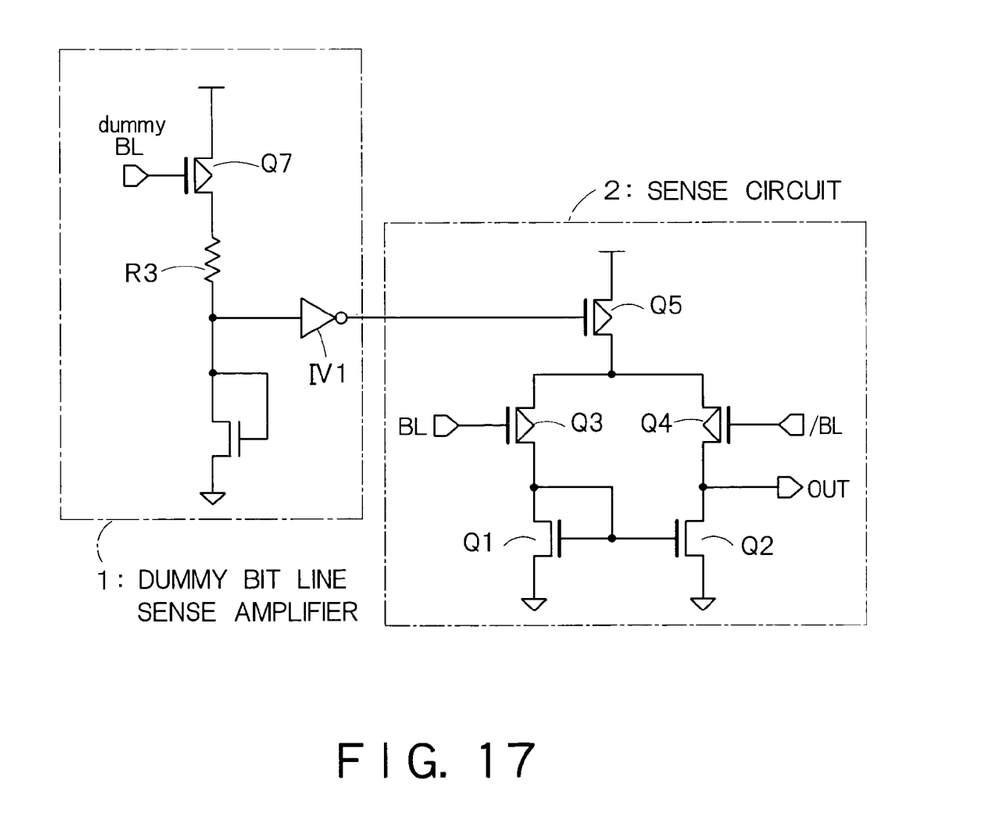
FIG. 17 is a circuit diagram showing an example in which a conductive type of the transistor of FIG. 10 is contrary.

Furthermore, a conductive type of each transistor in the circuits shown in FIGS. 1, 3, 6–10 may be inverse. In this case, the circuit of FIG. 1 is replaced with the circuit of FIG. 11, the circuit of FIG. 3 is replace with the circuit of FIG. 12, the circuit of FIG. 6 is replace with the circuit of FIG. 13, the circuit of FIG. 7 is replace with the circuit of FIG. 14, the circuit of FIG. 8 is replace with the circuit of FIG. 15, the circuit of FIG. 9 is replace with the circuit of FIG. 16, the circuit of FIG. 10 is replace with the circuit of FIG. 17.

Even in the circuits of FIGS. 11–17, because the resistor elements R1, R2 and R3 are provided, it is possible to cancel out the offset voltages of the sense amplifier and the dummy bit line sense amplifier.

What is claimed is:

1. A semiconductor integrated circuit comprising:
two input nodes forming a pair;
two output nodes configured to output amplification signals in accordance with a difference in signals inputted to said two input nodes; and
at least one switching circuit for switching to a specific state in order to detect an input offset voltage of said semiconductor integrated circuit before a signal to be amplified is inputted to said input node; and said amplification signals are outputted from said two output nodes on a state that the input offset voltage of said semiconductor integrated circuit is corrected.

2. A semiconductor integrated circuit comprising:
first and second transistors having gate terminals being connected to each other and one drain terminal being connected to the other drain terminal;
third and fourth transistors having gate terminals being connected to each other and one drain terminal being connected to the other drain terminal;
a fifth transistor connected between a connection point of said respective drain terminals of said first and second transistors and a first data line;
a sixth transistor connected between a connection point of said respective drain terminals of said third and fourth transistors and a second data line; and
an offset supply circuit configured to supply an offset voltage to at least one of said first and second data lines before turning on said fifth and sixth transistors in order to cancel out said input offset voltage of said semiconductor integrated circuit,
wherein said connection point of said respective drain terminals of said first and second transistors is connected to said respective gate terminals of said third and fourth transistors, and said respective gate terminals of said first and second transistors are connected to a connection point of the respective drain terminals of the third and fourth transistors.

3. A semiconductor integrated circuit comprising:
first and second transistors having gate terminals being connected to each other and one drain terminal being connected to the other drain terminal;
third and fourth transistors having gate terminals being connected to each other and one drain terminal being connected to the other drain terminal;
a fifth transistor connected between a connection point of said respective drain terminals of said first and second transistors and a first data line;
a sixth transistor connected between a connection point of said respective drain terminals of said third and fourth transistors and a second data line;
a seventh transistor connected between said respective gate terminals of said first and second transistors and said first data line; and
an eighth transistor connected between said respective gate terminals of said third and fourth transistors and said second data line,
wherein said connection point of said respective drain terminals of said first and second transistors is connected to said respective gate terminals of said third and fourth transistors, and said respective gate terminals of said first and second transistors are connected to said respective drain terminals of said third and fourth transistors.

4. The semiconductor integrated circuit according to claim 3, further comprising an offset control circuit configured to turn on said seventh and eighth transistors, supplying an offset voltage to at least one of said first and second data lines, and thereafter turning on said fifth and sixth transistors in such a manner that said input offset voltage detected in the state where said seventh and eighth transistors are in the OFF mode is canceled out.

5. A semiconductor integrated circuit comprising:
first and second transistors having one source terminal connected to the other drain terminal;
third and fourth transistors having one source terminal connected to the other drain terminal;
a fifth transistor connected between said source terminals of said second and fourth transistors and a first voltage terminal;
a sixth transistor connected between said drain terminals of said first and third transistors and a second voltage terminal;
a seventh transistor connected between said source terminals of said second and fourth transistors and said second voltage terminal;
an eighth transistor having a gate terminal being connected to a gate terminal of said first transistor and having a drain terminal being connected to said source terminal of said first transistor and a gate terminal of said third transistor;
a ninth transistor having a gate terminal being connected to a gate terminal of said third transistor and having a drain terminal being connected to said source terminal of said third transistor and a gate terminal of said first transistor; and
a tenth transistor connected between source terminals of said eighth and ninth transistors and said first voltage terminal,
wherein a first data line is connected to a gate terminal of said second transistor and a second data line is connected to a gate terminal of said fourth transistor.

6. A semiconductor integrated circuit comprising:
first and second transistors having gate terminals being connected to each other and one drain terminal being connected to the other drain terminal;
third and fourth transistors having gate terminals connected to each other and one drain terminal being connected to the other drain terminal;
a fifth transistor connected between a connection point of said both drain terminals of said first and second transistors and a first data line;
a sixth transistor connected between a connection point of said both drain terminals of said third and fourth transistors and a second data line;
a first voltage setting circuit capable of further strongly (further weakly) holding high-level voltages of said both gate terminals of said first and second transistors; and
a second voltage setting circuit capable of further strongly (further weakly) holding high-level voltages of said both gate terminals of said third and fourth transistors,
wherein said connection point of said both drain terminals of said first and second transistors is connected to said respective gate terminals of said third and fourth transistors, and said respective gate terminals of said first and second transistors are connected to said connection point of said both drain terminals of the third and fourth transistors.

* * * * *